(12) United States Patent
He et al.

(10) Patent No.: US 6,538,891 B1
(45) Date of Patent: Mar. 25, 2003

(54) HEAT SINK CLIP ASSEMBLY

(75) Inventors: Li He, Shenzhen (CN); Tsung-Lung Lee, Tu-Chen (TW); Cheng-Tien Lai, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/081,640

(22) Filed: Feb. 21, 2002

(51) Int. Cl.[7] .................................................. H05K 7/20
(52) U.S. Cl. ........................ 361/704; 361/719; 257/718; 257/719; 248/510
(58) Field of Search ............................. 361/704, 707, 361/709, 710, 719; 257/718, 719, 727; 174/16.3; 165/80.3, 185; 248/510

(56) References Cited

U.S. PATENT DOCUMENTS

| | | | | |
|---|---|---|---|---|
| 5,331,507 A | * | 7/1994 | Kyung et al. ............... | 361/720 |
| 5,640,305 A | * | 6/1997 | Smithers ..................... | 361/719 |
| 5,757,621 A | * | 5/1998 | Patel ........................... | 361/719 |
| 5,771,155 A | * | 6/1998 | Cook ........................... | 361/710 |
| 6,160,710 A | * | 12/2000 | Ahl et al. .................... | 361/707 |
| 6,390,475 B1 | * | 5/2002 | Eckblad et al. ............. | 277/312 |

* cited by examiner

Primary Examiner—Boris Chervinsky
(74) Attorney, Agent, or Firm—Wei Te Chung

(57) ABSTRACT

A heat sink clip assembly for attaching a heat sink (30) to a CPU (40) mounted to a motherboard (50) includes a rigid shaft (10) and two wire clips (20). The shaft includes a pressing section (12) for pressing the heat sink, two engaging sections (14) at opposite ends of the pressing section, and two stop sections (16) at outmost ends of the engaging sections. A diameter of the engaging sections is less than diameters of the pressing section and the stop sections. Each wire clip has a coiled portion (22), and two spring arms (24) extending from opposite ends of the coiled portion. Each spring arm extends perpendicularly to a central axis of the coiled portion. A hook (26) is formed at a distal end of each spring arm, for engaging with a corresponding through hole (52) of the motherboard. The heat sink is thereby attached to the motherboard.

18 Claims, 5 Drawing Sheets

HEAT SINK CLIP ASSEMBLY

BACKGROUND OF THE INVENTION

1. Field of the Invention

The present invention relates to securing of heat sinks to electronic devices, and particularly to clips of heat sink clip assemblies that have coil structures which can be configured to provide suitable pressing force acting on a heat sink.

2. Related Art

Advances in microelectronics technology have resulted in electronic devices which process signals and data at unprecedented high speeds. During operation of many contemporary electronic devices such as central processing units (CPUs), large amounts of heat are produced. The heat must be efficiently removed, to prevent the system from becoming unstable or being damaged. Heat sink assemblies are frequently used to dissipate heat from these electronic devices.

A clip is often used to attach a heat sink to an electronic device. The clip is usually integrally formed from plastic material, or made by bending a spring steel wire. Examples of such heat sink clips are disclosed in U.S. Pat. Nos. 5,464,054, 5,640,305 and 6,105,215. Mass-producing plastic clips requires developing a set of dies over a relatively long period of time. This results in high development costs. Once the dies are developed, it is difficult to change a required configuration of the clips. Furthermore, configurations of plastic clips are limited in scope. Oftentimes, it is impossible to obtain a configuration of a plastic clip that enables the clip to avoid interference with other components inside a computer. Wire clips can be configured to avoid such interference. However, it is problematic to obtain spring steel wire with a suitable hardness, having regard to the conflicting objectives of providing sufficient pressing force and providing sufficient resiliency for manual operation.

Thus, an improved heat sink clip assembly which overcomes the above problems is desired.

BRIEF SUMMARY OF THE INVENTION

Accordingly, an object of the present invention is to provide a heat sink clip assembly having coiled structures which can be easily configured to meet the pressing force requirements of any particular application.

Another object of the present invention is to provide a heat sink clip assembly which readily and securely attaches a heat sink to an electronic device.

To achieve the above-mentioned objects, a heat sink clip assembly of the present invention is used to attach a heat sink to a CPU which is mounted to a motherboard. The heat sink clip assembly comprises a rigid shaft and two wire clips. The rigid shaft comprises a pressing section for pressing the heat sink, two engaging sections at opposite ends of the pressing section, and two stop sections at outmost ends of the engaging sections. A diameter of the engaging sections is less than diameters of the pressing section and the stop sections. Each wire clip has a coiled portion, and two spring arms extending from opposite ends of the coiled portion. Each spring arm extends perpendicularly to a central axis of the coiled portion. A hook is formed at a distal end of each spring arm, for engaging with a corresponding through hole of the motherboard. The heat sink is thereby attached to the motherboard.

Other objects, advantages and novel features of the present invention will be drawn from the following detailed description of a preferred embodiment of the present invention together with the attached drawings, in which:

DESCRIPTION OF THE PREFERRED EMBODIMENT

Figure 1:
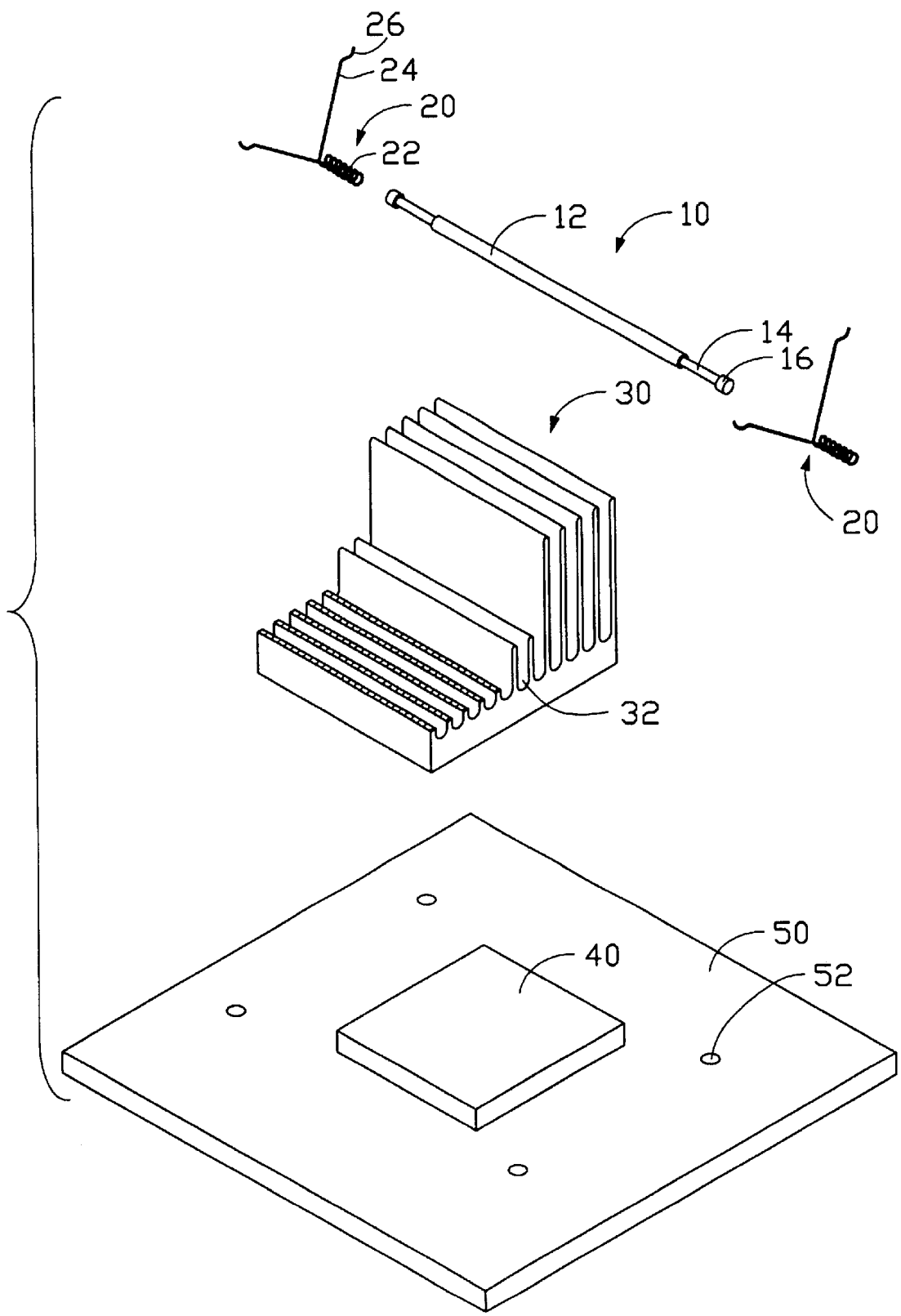
FIG. 1 is an exploded view of a heat sink clip assembly in accordance with the present invention, together with a heat sink, a CPU and a motherboard.

Referring to FIG. 1, a heat sink clip assembly in accordance with the present invention is used to attach a heat sink 30 to a CPU 40 which is mounted to a motherboard 50. The heat sink 30 has a groove 32 defined through a middle thereof, for accommodating the heat sink clip assembly. A plurality of through holes 52 is defined in the motherboard 50 around the CPU 40. The heat sink clip assembly comprises a rigid shaft 10, and a pair of elastically deformable wire clips 20.

The rigid shaft 10 has a circular cross section. The rigid shaft 10 comprises a central pressing section 12, two engaging sections 14 at respective opposite ends of the pressing section 12, and two stop sections 16 at respective outmost ends of the engaging sections 14. The rigid shaft 10, the engaging sections 14 and the stop sections 16 are all coaxial with one another. A cross-sectional diameter of each engaging section 14 is less than cross-sectional diameters of the pressing section 12 and the stop sections 16.

Each wire clip 20 is integrally made from a single piece of spring steel wire. The wire clip 20 comprises a coiled portion 22, and two spring arms 24 respectively extending from opposite ends of the coiled portion 22. Each spring arm 24 extends perpendicularly relative to a central axis of the coiled portion 22. From a side elevational view of the wire clip 20, the spring arms 24 form an angle β of approximately 90° therebetween when there is no force acting on either of the spring arms 24 (see FIG. 5B). A distal end of each spring arm 24 is further bent to form a hook 26.

Figure 2:
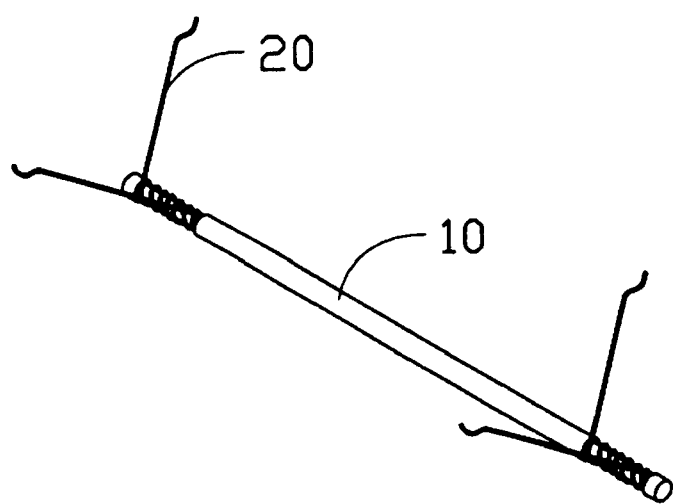
FIG. 2 is an assembled view of the heat sink clip assembly of FIG. 1.
Figure 5A:
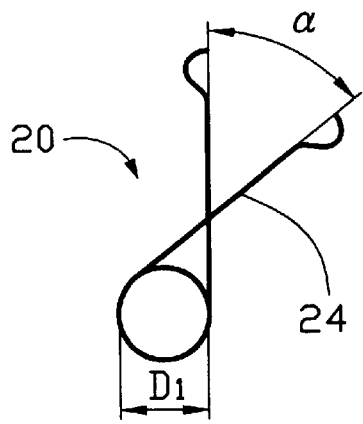
FIGS. 5A–5C are schematic side plan views of one clip of the heat sink clip assembly of FIG. 1, showing spring arms of the clip oriented at different angles relative to each other.
Figure 5B:
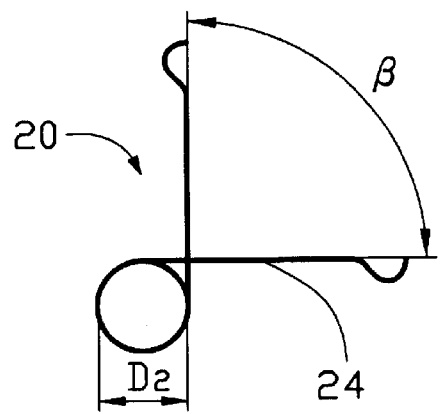

Referring to FIGS. 2, 5A and 5B, in assembly, the wire clips 20 are respectively attached on the engaging sections 14 of the rigid shaft 10. The spring arms 24 of each wire clip 20 are manually squeezed toward each other. The angle between the spring arms 24 changes from β to α, and an interior diameter of the coiled portion 22 accordingly changes from D2 to D1 (see FIGS. 5A and 5B). Diameter D1 is greater than the cross-sectional diameter of the stop sections 16. The coiled portion 22 of the wire clip 20 is passed over the corresponding stop section 16 and positioned over the corresponding engaging section 14. The spring arms 24 are then released. The spring arms 24 resiliently return to their original orientations. The angle between the spring arms 24 returns to β, and the interior diameter of the coiled portion 22 accordingly returns to D2. Diameter D2 is less than the cross-sectional diameter of the stop sections 16 and the pressing section 12. Therefore, the wire clip 20 is held on the engaging section 14 between the pressing section 12 and the stop section 16.

Figure 3:
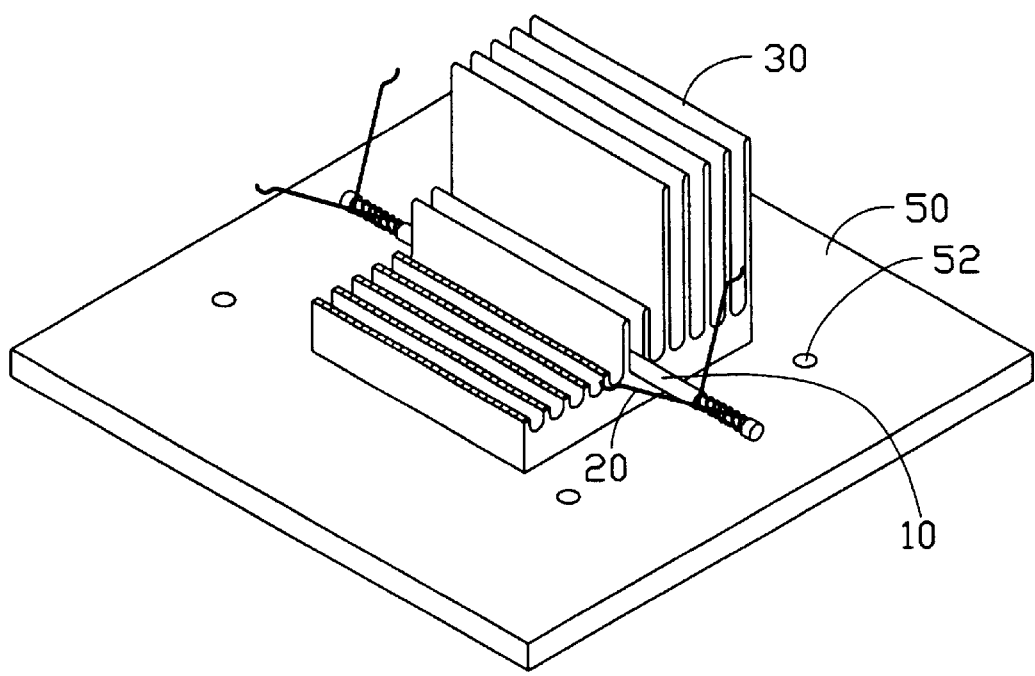
FIG. 3 is a partly assembled view of FIG. 1.
Figure 4:
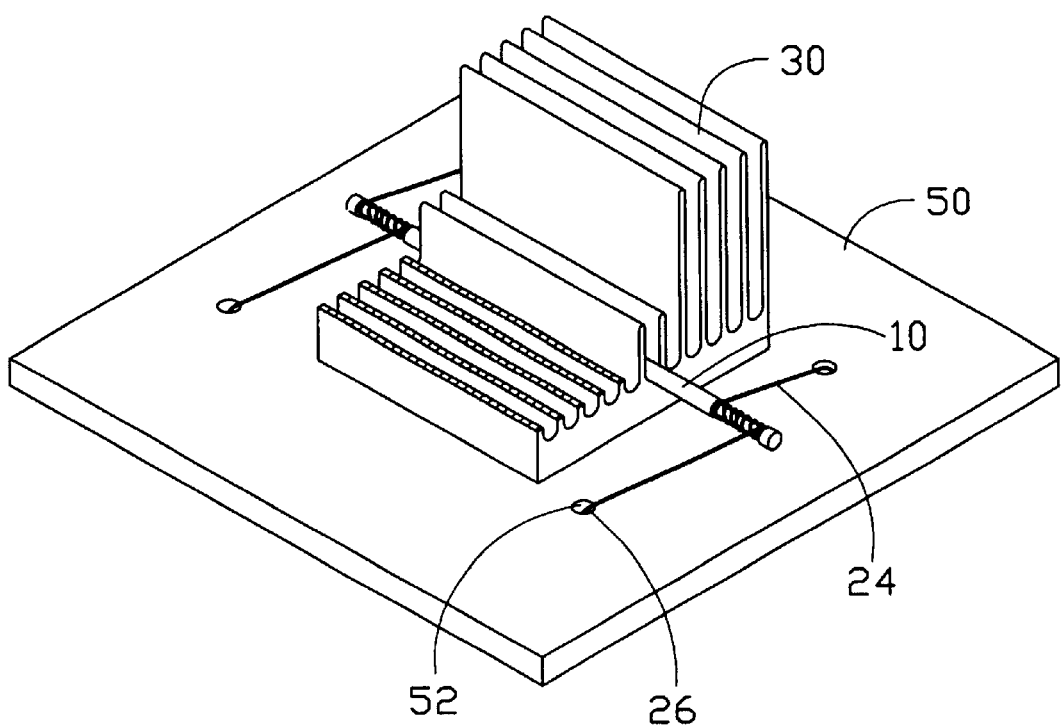
FIG. 4 is a fully assembled view of FIG. 1.
Figure 5C:
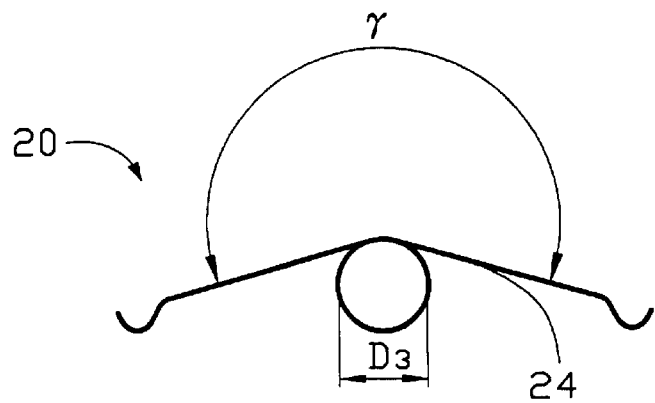

Referring also to FIGS. 3, 4 and 5C, in use, the pressing section 12 of the rigid shaft 10 is placed into the groove 32 of the heat sink 30. The heat sink 30 is placed onto a top surface of the CPU 40. The spring arms 24 of each wire clip 20 are pressed outwardly away from each other. The angle between the spring arms 24 changes from β to γ, and the interior diameter of the coiled portion 22 accordingly changes from D2 to D3 (see FIG. 5C). Diameter D3 is less than diameter D2, and is therefore less than the cross-sectional diameter of the stop sections 16 and the pressing section 12. The hooks 26 of the wire clip 20 are engagably extended into the corresponding through holes 52 of the motherboard 50. The wire clips 20 thereby resiliently cause the pressing section 12 of the rigid shaft 10 to press the heat sink 30 firmly on the top surface of the CPU 40.

The wire clips 20 of the heat sink clip assembly are separate parts. They can be readily removed from the rigid shaft 10 by squeezing the corresponding spring arms 24 toward each other. Thus, a composition of the wire, a cross-sectional diameter of the wire, a diameter of the coiled portion 22, and an amount and concentration of coiling of the coiled portion 22 can be configured to meet the pressing force requirements of any particular application. Furthermore, unlike conventional plastic clips, the heat sink clip assembly can be configured to avoid interference with other components on and around the motherboard 50. This can be done by configuring suitable lengths of the spring arms 24 and/or by configuring suitable angles formed between the spring arms 24 and the coiled portion 22.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A heat sink clip assembly for attaching a heat sink to an electronic device which is mounted to a motherboard, the heat sink clip assembly comprising:
   a shaft comprising a pressing section for pressing the heat sink, and two engaging sections at opposite ends of the pressing section, a diameter of each of the engaging sections being less than a diameter of the pressing section; and
   two wire clips, each of the clips comprising a coiled portion engaging with a corresponding engaging section of the shaft, and two spring arms extending from opposite ends of the coiled portion for engaging with the motherboard.

2. The heat sink clip assembly as described in claim 1, wherein the rigid shaft further comprises two stop sections disposed at outmost ends of the engaging sections, wherein the diameter of each of the engaging sections is less than a diameter of each of the stop sections.

3. The heat sink clip assembly as described in claim 1, wherein each of the wire clips is integrally made from a single piece of spring steel wire.

4. The heat sink clip assembly as described in claim 1, wherein the clips provide an amount of pressing force according to a composition of the wire, a cross-sectional diameter of the wire, a diameter of the coiled portion, and an amount and concentration of coiling of the coiled portion.

5. The heat sink clip assembly as described in claim 1, wherein each of the spring arms of each of the clips extends generally perpendicularly relative to a central axis of the coiled portion, and the two spring arms of each of the clips form a predetermined angle therebetween.

6. The heat sink clip assembly as described in claim 1, wherein a hook is formed at a distal end of each of the spring arms, for engaging with the motherboard.

7. A heat dissipating assembly comprising:
   a motherboard;
   an electronic device mounted on the motherboard;
   a heat sink attached on the electronic device, the heat sink having a groove defined therein; and
   a clip assembly comprising a shaft received in the groove and pressing the heat sink on the electronic device, and a pair of wire clips releasably attached to opposite ends of the shaft, the wire clips having engaging means engaging with the motherboard thereby resiliently attaching the heat sink on the electronic device.

8. The heat dissipating assembly as described in claim 7, wherein the shaft has a pressing section, two engaging sections at opposite ends of the pressing section, and two stop sections at outmost ends of the engaging sections, and a diameter of each of the engaging sections is less than diameters of the pressing section and the stop sections.

9. The heat dissipating assembly as described in claim 8, wherein each of the wire clips is integrally made of a single piece of spring steel wire, has a coiled portion engaged over a corresponding engaging section of the shaft, and further has two spring arms extending from opposite ends of the coiled portion.

10. The heat dissipating assembly as described in claim 9, wherein four through holes are defined in the motherboard around the electronic device, a hook is formed at a distal end of each of the spring arms, and each of the hooks is engaged in a corresponding through hole.

11. A method for dissipating heat from an electronic device on a printed circuit board which defines a plurality of holes near the electronic device, comprising:
   preparing a heat sink defining a groove therein;
   preparing a shaft having a middle pressing section, an engaging section adjacent an outer end of the pressing section and a stop section adjacent an outer end of the engaging section, wherein the pressing and stop sections each have a cross-sectional size larger than that of the engaging section;
   preparing a wire clip having a coiled portion and two spring arms extending from opposite ends of the coiled portion, wherein the coiled portion has a first diameter which is larger than the cross-sectional size of the engaging section and smaller than the cross-sectional sizes of the pressing section and the stop section when the spring arms are at a first position, and the coiled portion has a second diameter which is larger than any of the cross-sectional sizes of the engaging and stop sections when the spring arms are at a second position;
   moving the spring arms of the wire clip from the first position to the second position, mounting the wire clip to the engaging section, and returning the spring arms of the wire clip to the first position;
   putting the pressing section into the groove of the heat sink, placing the heat sink on the electronic device and moving the spring arms of the wire clip to a third position in which the spring arms are securely engaged in the holes of the printed circuit board, whereby the pressing section exerts a pressing force on the heat sink toward the electronic device to make the heat sink intimately contact the electronic device.

12. The method in accordance with claim 11, wherein at the first position, there is no force acting on either of the spring arms.

13. The method in accordance with claim 12, wherein at the first position an angle between the springs arms is substantially equal to 90 degrees.

14. The method in accordance with claim 13, wherein when the spring arms of the wire clip are moved from the first position to the second position, force is applied on the spring arms to squeeze them toward each other so that the angle between the spring arms at the second position is less than 90 degrees.

15. The method in accordance with claim 14, wherein at the third position, the coiled portion has a third diameter which is greater than the cross-sectional size of the engaging section and smaller than the cross-sectional sizes of the pressing section and the stop section, and the angle between the two spring arms is greater than 90 degrees.

16. The method in accordance with claim 11, wherein at the third position, the coiled portion has a third diameter which is greater than the cross-sectional size of the engaging section and smaller than the cross-sectional sizes of the pressing section and the stop section, and an angle between the two spring arms is greater than 90 degrees.

17. A heat dissipating assembly comprising:

a printed circuit board defining a heat sink area with therein a plurality of retention holes surrounding said area;

an electronic device positioned above the printed circuit board;

a heat sink seated upon said electronic device, said heat sink defining at least one groove; and a clip assembly comprising a rigid shaft received in said groove to press the heat sink against the electronic device, and at least a resilient clip with a coil portion axially surrounding said shaft and a pair of opposite free ends latchably engaged within the corresponding retention holes, respectively, located by two sides of said shaft; wherein said clip is in a torsion manner while the shaft is in a depression manner.

18. The assembly as described in claim 17, wherein there are two resilient clips respectively disposed around two opposite ends of the shaft, and located and exposed by two sides of said heat sink.

* * * * *